(12) United States Patent
Liao et al.

(10) Patent No.: US 10,276,421 B2
(45) Date of Patent: Apr. 30, 2019

(54) INTEGRATED FAN-OUT PACKAGE, INTEGRATED FAN-OUT PACKAGE ARRAY, AND METHOD OF MANUFACTURING INTEGRATED FAN-OUT PACKAGES

(71) Applicant: Taiwan Semiconductor Manufacturing Co., Ltd., Hsinchu (TW)

(72) Inventors: Sih-Hao Liao, New Taipei (TW); Hung-Jui Kuo, Hsinchu (TW); Yu-Hsiang Hu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 9 days.

(21) Appl. No.: 15/146,893

(22) Filed: May 5, 2016

(65) Prior Publication Data

US 2017/0271227 A1   Sep. 21, 2017

Related U.S. Application Data

(60) Provisional application No. 62/308,230, filed on Mar. 15, 2016.

(51) Int. Cl.
| | |
|---|---|
| *H01L 21/683* | (2006.01) |
| *H01L 23/31* | (2006.01) |
| *H01L 21/56* | (2006.01) |
| *H01L 23/00* | (2006.01) |

(Continued)

(52) U.S. Cl.
CPC ........ *H01L 21/6835* (2013.01); *H01L 21/561* (2013.01); *H01L 21/78* (2013.01); *H01L 23/3121* (2013.01); *H01L 23/3135* (2013.01); *H01L 24/32* (2013.01); *H01L 24/96* (2013.01); *H01L 24/97* (2013.01); *H01L 21/568* (2013.01); *H01L 23/291* (2013.01); *H01L 23/3185* (2013.01); *H01L 24/05* (2013.01); *H01L 24/13* (2013.01); *H01L 2221/68327* (2013.01); *H01L 2221/68359* (2013.01); *H01L 2221/68381* (2013.01); *H01L 2224/0231* (2013.01); *H01L 2224/0237* (2013.01);

(Continued)

(58) Field of Classification Search
CPC ..... H01L 25/0655; H01L 25/50; H01L 24/14; H01L 23/3135
USPC ......................................... 257/773, E23.128
See application file for complete search history.

(56) References Cited

U.S. PATENT DOCUMENTS

| | | | | |
|---|---|---|---|---|
| 8,907,476 | B2 * | 12/2014 | Lin | ......................... H01L 21/78 257/737 |
| 9,202,769 | B2 * | 12/2015 | Lin | ..................... H01L 23/5389 |

(Continued)

*Primary Examiner* — Marcos D. Pizarro
*Assistant Examiner* — Antonio B Crite
(74) *Attorney, Agent, or Firm* — JCIPRNET

(57) ABSTRACT

An integrated fan-out package including a die, an insulating encapsulation, a filler, and a redistribution circuit structure is provided. The insulating encapsulation encapsulates sidewalls of the die, and the insulating encapsulation includes a recess on a top surface thereof. The filler covers the top surface of the insulating encapsulation and is being at least partially filled in the recess. The redistribution circuit structure covers an active surface of the die and the filler while being electrically connected to the die. The redistribution structure includes a dielectric layer covering the die and the filler. In addition, a method of manufacturing integrated fan-out packages is also provided.

20 Claims, 10 Drawing Sheets

(51) Int. Cl.
*H01L 21/78* (2006.01)
*H01L 23/29* (2006.01)

(52) U.S. Cl.
CPC .............. *H01L 2224/05024* (2013.01); *H01L 2224/05124* (2013.01); *H01L 2224/05147* (2013.01); *H01L 2224/13144* (2013.01); *H01L 2224/13147* (2013.01); *H01L 2224/32225* (2013.01); *H01L 2924/0103* (2013.01); *H01L 2924/0104* (2013.01); *H01L 2924/0105* (2013.01); *H01L 2924/01012* (2013.01); *H01L 2924/01013* (2013.01); *H01L 2924/01022* (2013.01); *H01L 2924/01024* (2013.01); *H01L 2924/01025* (2013.01); *H01L 2924/01031* (2013.01); *H01L 2924/01038* (2013.01); *H01L 2924/01049* (2013.01); *H01L 2924/01073* (2013.01); *H01L 2924/01078* (2013.01); *H01L 2924/05042* (2013.01); *H01L 2924/05442* (2013.01)

(56) References Cited

U.S. PATENT DOCUMENTS

| | | | |
|---|---|---|---|
| 2013/0056867 A1* | 3/2013 | Pagaila | H01L 24/96 257/737 |
| 2013/0200528 A1* | 8/2013 | Lin | H01L 21/6836 257/774 |
| 2014/0091482 A1* | 4/2014 | Lin | H01L 24/11 257/782 |
| 2014/0217597 A1* | 8/2014 | Lin | H01L 24/19 257/773 |
| 2015/0131939 A1* | 5/2015 | Tseng | G02B 6/12004 385/14 |
| 2016/0013152 A1* | 1/2016 | Yu | H01L 21/31053 257/773 |
| 2016/0056126 A1* | 2/2016 | Yu | H01L 21/565 257/737 |

* cited by examiner

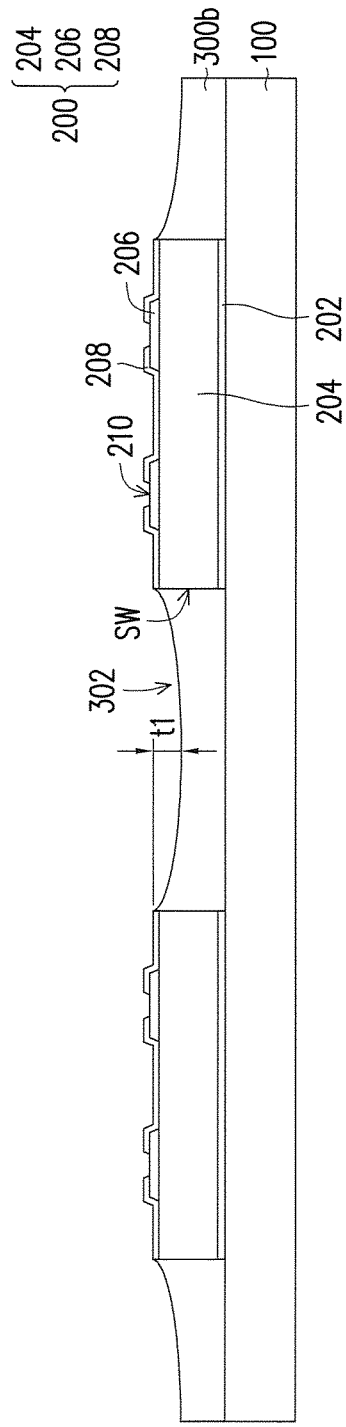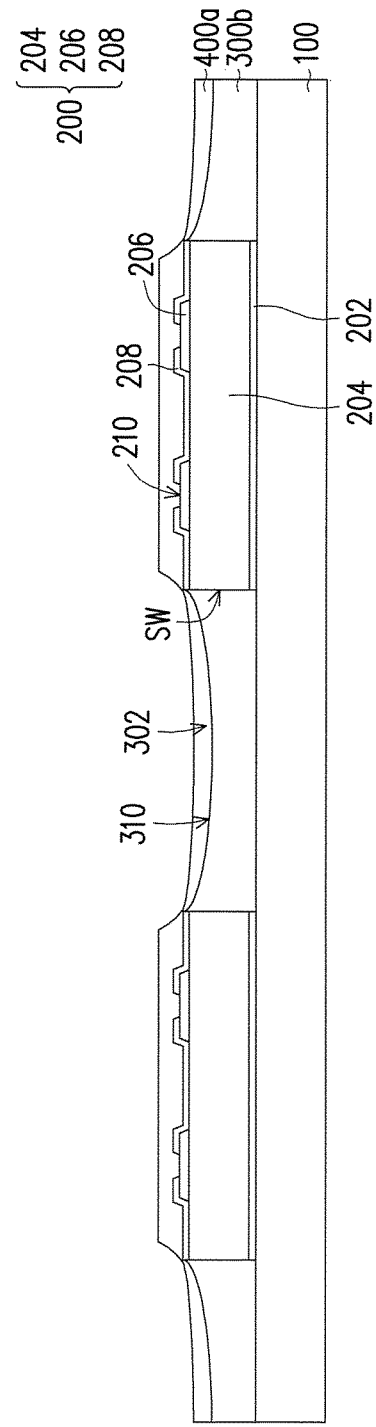

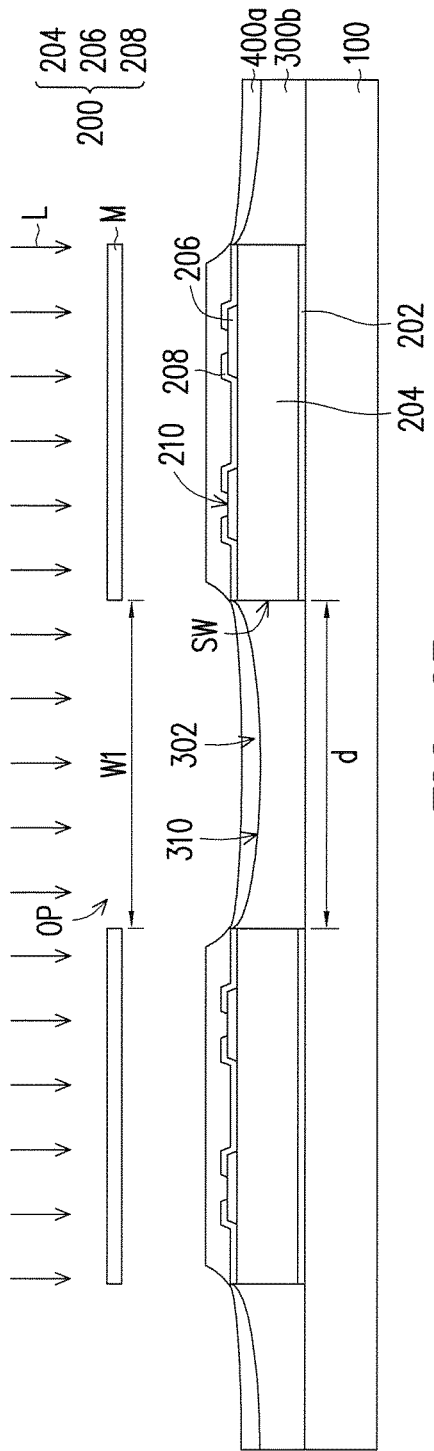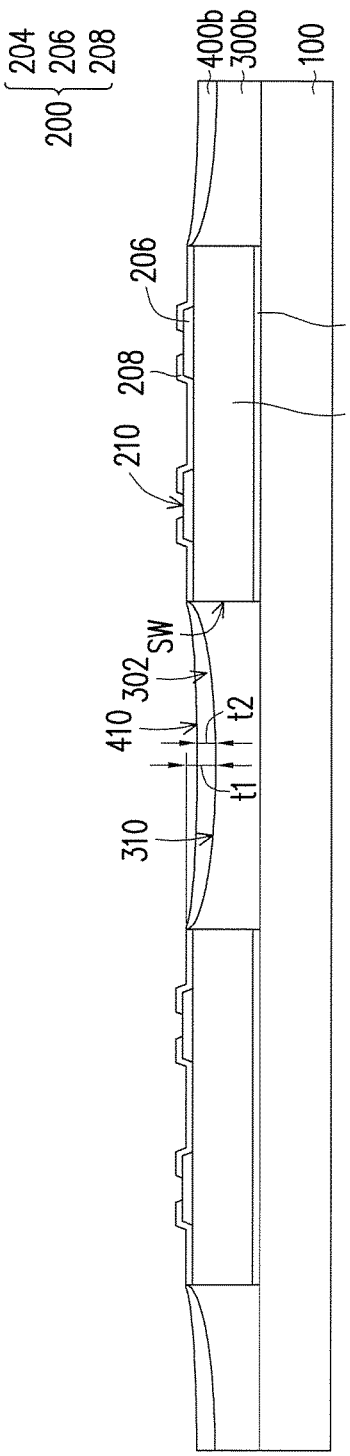
FIG. 2E
FIG. 2F

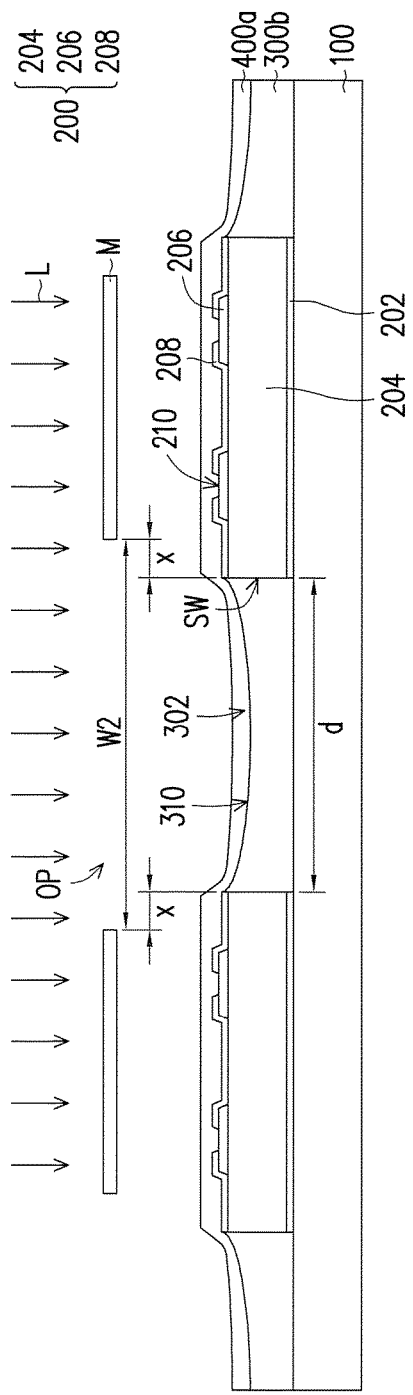
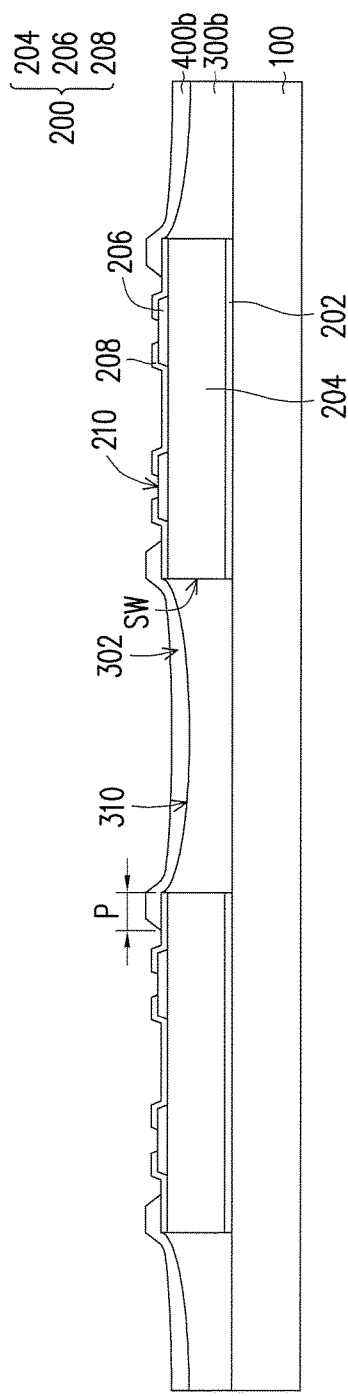

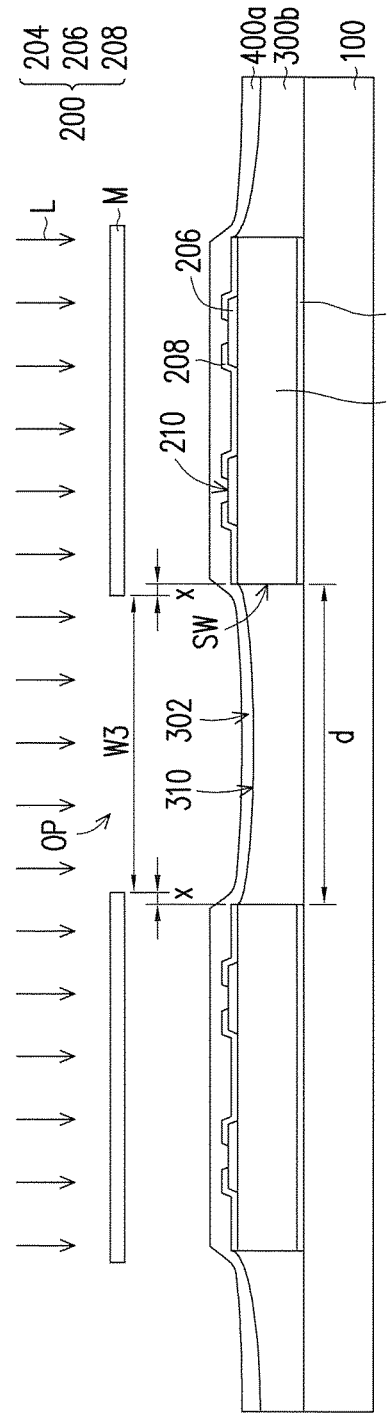
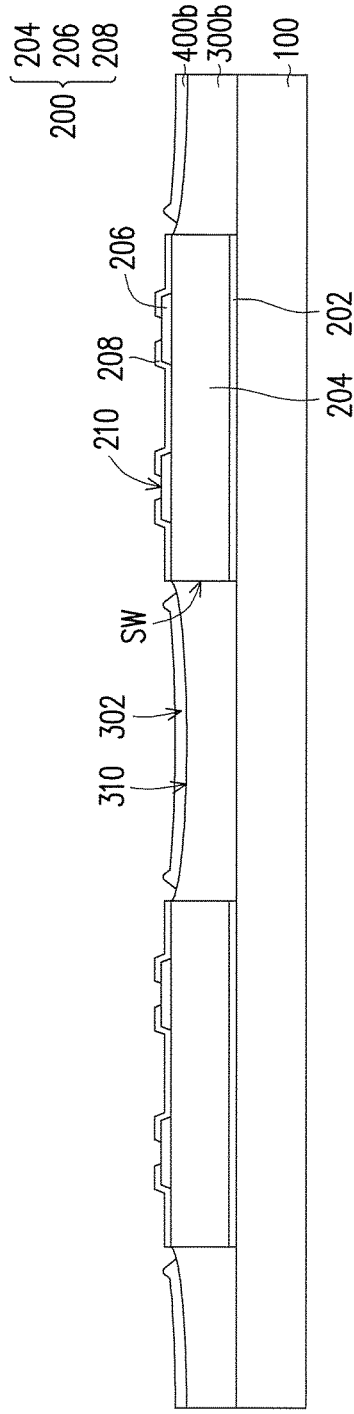
FIG. 4A
FIG. 4B

INTEGRATED FAN-OUT PACKAGE, INTEGRATED FAN-OUT PACKAGE ARRAY, AND METHOD OF MANUFACTURING INTEGRATED FAN-OUT PACKAGES

CROSS-REFERENCE TO RELATED APPLICATION

This application claims the priority benefits of U.S. provisional application Ser. No. 62/308,230, filed on Mar. 15, 2016. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g. transistors, diodes, resistors, capacitors, etc. For the most part, this improvement in integration density has come from successive reductions in minimum feature size, which allows more components to be integrated into a given area. These smaller electronic components also require smaller packages that occupy less area than previous packages.

Currently, integrated fan-out packages are becoming increasingly popular for their compactness. In the integrated fan-out packages, formation of the redistribution circuit structure plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2K are cross-sectional views illustrating a manufacturing process of integrated fan-out packages in accordance with some embodiments.

FIGS. 3A-3B are cross-sectional views illustrating intermediate steps for a manufacturing process of integrated fan-out packages in accordance with some embodiments.

FIGS. 4A-4B are cross-sectional views illustrating intermediate steps for a manufacturing process of integrated fan-out packages in accordance with some embodiments.

DETAILED DESCRIPTION

Figure 1:
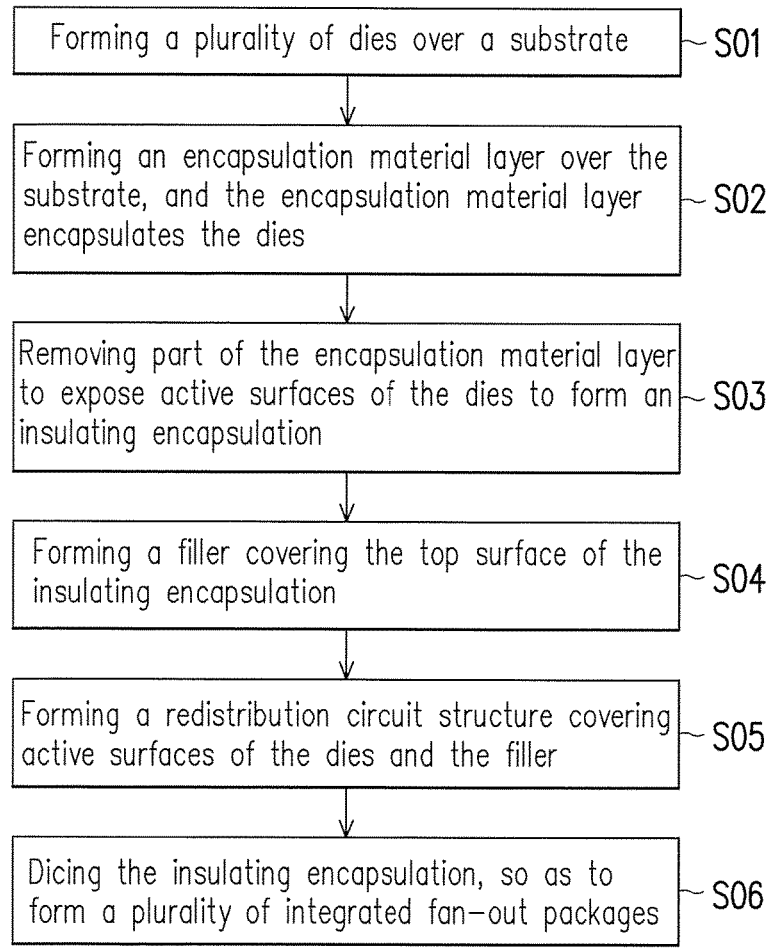
FIG. 1 is a flow chart illustrating a method of manufacturing integrated fan-out packages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart illustrating a method of manufacturing integrated fan-out packages in accordance with some embodiments. FIGS. 2A-2K are cross-sectional views illustrating a manufacturing process of integrated fan-out packages in accordance with some embodiments.

Figure 2A:
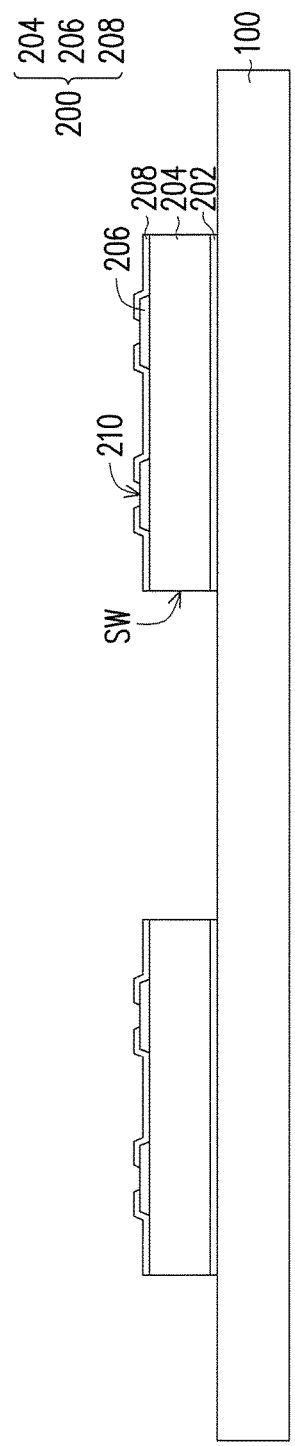

Referring to FIG. 1 and FIG. 2A, in step S01, a plurality of dies 200 are arranged in an array over a substrate 100. In some embodiments, the substrate 100 is a glass substrate. However, other material may be adapted as a material of the substrate 100 as long as the material is able to withstand the subsequent processes while carrying the package structure formed thereon. Each die 200 includes a semiconductor chip 204, a plurality of connectors 206, and a passivation layer 208. Moreover, each die 200 has an active surface 210 which connects two sidewalls SW of the die 200. A die attach film (DAF) 202 is formed between a bottom surface of the semiconductor chip 204 and the substrate 100 to enhance the adhesion between the die 200 and the substrate 100. It should be noted that depending on the application, if the dies 200 are required to be separate from the substrate 100 in the subsequent processes, the die attach film 202 may be replaced by a de-bonding layer such as a LTHC (light to heat conversion) release layer. For example, the de-bonding layer may be irradiated by an UV laser such that the dies 200 are peeled from the substrate 100. On the other hand, the connectors 206 are formed over a top surface of the semiconductor chip 204 for electrical connection between the die 200 and other components. The connectors 206 may include conductive pads (e.g., aluminum pads, copper pads or the like), conductive pillars (e.g. solder pillars, gold pillars, copper pillars or the like), conductive bumps (e.g., reflowed solder bumps, gold bumps, copper bumps or the like) or the combinations thereof. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. The passivation layer 208 is formed over the semiconductor chip 204 and the connectors 206 while exposing at least part of the connectors 206. The passivation layer 208 is made of insulating materials. In some embodiments, the passivation layer 208 is a silicon oxide layer, a silicon nitride layer or the like.

Figure 2B:
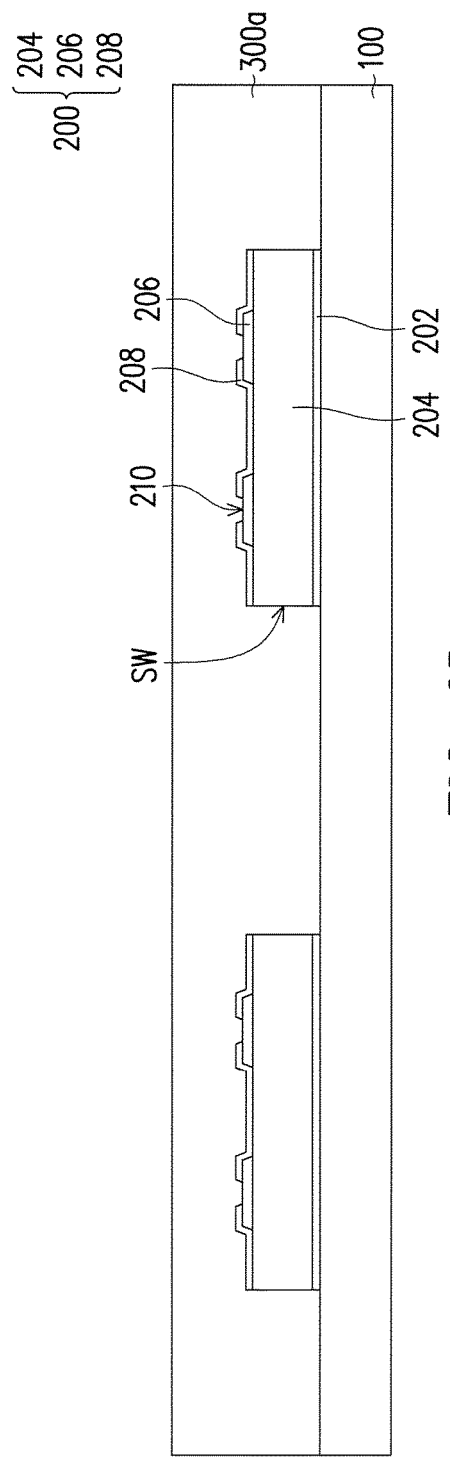

Referring to FIG. 1 and FIG. 2B, in step S02, an encapsulation material layer 300a is formed over the substrate 100. Specifically, the encapsulation material layer 300a encapsulates the die 200. In other words, the dies 200 are not reveled and are well protected by the encapsulation material layer 300a. In some embodiments, the encapsulation material layer 300a may be a molding compound formed by molding processes. However, in some alternative embodiments, the encapsulation material layer 300a may be formed by an insulating material such as epoxy or other suitable resins. Meanwhile, the encapsulation material layer 300a may be formed through other processes corresponding to the insulating material selected.

Referring to FIG. 1 and FIG. 2C, in step S03, part of the encapsulation material layer 300a is removed to expose the active surfaces 210 of the dies 200, so as to form an insulating encapsulation 300b. In some embodiments, a thickness of the encapsulation material layer 300a is reduced through grinding. For example, a chemical mechanical polishing (CMP) technique may be employed. Since the insulating encapsulation 300b is formed through grinding, a recess 302 is formed on a top surface 310 of the insulating encapsulation 300b due to difference in polishing rate between the encapsulation material layer 300a and the dies 200. Depending on the material of the insulating encapsulation 300b and the grinding parameter, the recess 302 may have a maximum depth t1 ranging from 7 μm to 15 μm. In other words, a sinkage of the recess 302 ranges from 7 μm to 15 μm. The top surface 310 of the insulating encapsulation 300b may be a curved surface, and the depth of the recess 302 increases from sidewalls SW of the die 200 to a center of the recess 302. Moreover, in some embodiments, the insulating encapsulation 300b completely covers the sidewalls of the dies 200. However, it construes no limitation in the disclosure. In some alternative embodiments, the encapsulation material layer 300a may be slightly over-grinded, causing the highest level height of the top surface 310 of the recess 302 to be less than a height of the sidewalls SW of the dies 200. In this case, the insulating encapsulation 300b exposes at least part of the sidewalls SW of the dies 200.

Referring to FIG. 1 and FIGS. 2D-2F, in Step S04, a filler 400b is formed to cover the top surface 310 of the insulating encapsulation 300b. The formation of the filler 400b is described in detail herein. Referring to FIG. 2D, a photosensitive material 400a is formed over the dies 200 and the recess 302. In some embodiments, the photosensitive material 400a may include polyimide or the like. However, other suitable photo curable resin may be used as well. Moreover, in some embodiments, the photosensitive material 400a may be a negative type photoresist.

Subsequently, a mask M is provided over the photosensitive material 400a, as illustrated in FIG. 2E. In some embodiments, the mask M is brought in very close proximity to the photosensitive material 400a, but does not come in contact with the photosensitive material 400a during exposure. In alternative embodiments, the mask M is directly in contact with the photosensitive material 400a to ensure high-resolution pattern transfer. The mask M includes a plurality of openings OP corresponding to the insulating encapsulation 300b. As mentioned above, the insulating encapsulation 300b are located between two adjacent dies 200, and thus each of the openings OP may have a width W1 substantially equal to a distance d between two adjacent dies 200. In some embodiments, the distance d between two adjacent dies 200 is about 400 μm to 8000 μm, and thus the width W1 of each of the openings OP is also about 400 μm to 8000 μm. For example, the distance d between two adjacent dies 200 may be approximately 3200 μm to render the width W1 of 3200 μm. However, the widths W1 of the openings OP are not limited herein, and in some alternative embodiments, the widths W1 of the openings OP may be different from the distance d between two adjacent dies 200. Details with respect to these embodiments would be described in greater detail later. It is worth to note that since recesses 302 are formed on the top surface 310 of the insulating encapsulation 300b, the openings OP of the mask M are arranged corresponding to the recesses 302. Referring to FIG. 2E again, the photosensitive material 400a located in the openings OP of the mask M is subjected to irradiation of a light beam L. The light beam L may be a visible light, an ultraviolet light (e.g., an ultraviolet laser), or other suitable light with a specific wavelength capable of altering the chemical property of the photosensitive material 400a. In other words, the photosensitive material 400a exposed by the openings OP is cured, or alternatively speaking, cross-linked through the aid of the light beam L.

Referring to FIG. 2F, thereafter, a development process is performed on the photosensitive material 400a to remove excessive part of the photosensitive material 400a, thereby forming a filler 400b in the recess 302. In detail, the development process may be achieved through a photosensitive resist coating (PRC) dispense nozzle, for example. The development solution has high selectivity with respect to the cross-linked photosensitive material and the non-cross-linked photosensitive material, and thus the non-cross-linked portion of the photosensitive material 400a shielded by the mask M is removed. As mentioned above, since the openings OP are set corresponding to the recesses 302, at least part of the filler 400b is located in the recess 302. It should be noted that since the filler 400b is filled into the recess 302, the profile of a top surface 410 of the filler 400b would also encompass a sinkage. However, the sinkage of the top surface 410 of the filler 400b is less than the sinkage of the recess 302. For example, the sinkage of the top surface 410 of the filler 400b may range from 1 μm to 5 μm. In other words, a sinkage difference between the recess 302 and the top surface 410 of the filler 400b may range between 5 μm and 8 μm. Nevertheless, depending on the thickness of the photosensitive material 400a deposited in the earlier process, the sinkage of the filler 400b may be less than 1 μm, or even less than 0.5 μm. Similar to that of the recess 302, the top surface 410 of the filler 400b may be a curved surface. As illustrated in FIG. 2F, the filler 400b has a maximum thickness of t2, and the maximum thickness t2 of the filler 400b is smaller than the maximum depth t1 of the recess 302. However, FIG. 2F merely serves as an exemplary illustration, and the disclosure is not limited thereto. In other alternative embodiments, the thickness t2 of the filler 400b may be equal to the maximum depth t1 of the recess 302 or the thickness t2 of the filler 400b may be greater than the maximum depth t1 of the recess 302. In other words, the filler 400b may completely fill the recess 302 or even protrude from the plane parallel to the active surfaces 210 of the dies 200. It should be noted that the maximum thickness t2 of the filler 400b ranges from 4 μm to 15 μm.

Figure 2G:
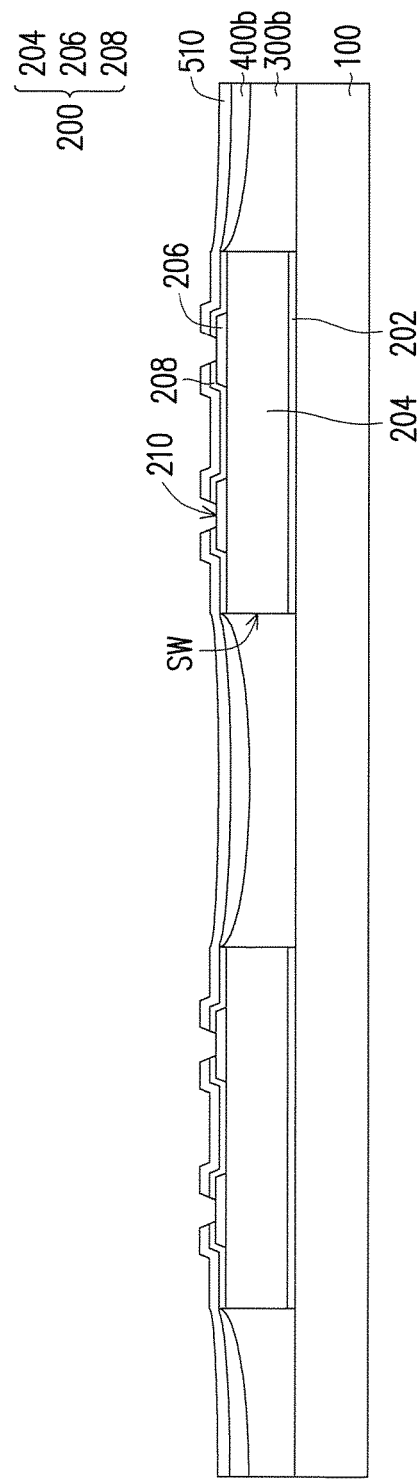

Referring to FIG. 1 and FIGS. 2G-2I, in Step S05, a redistribution circuit structure 500 covering the active surfaces 210 of the dies 200 and the filler 400b is formed. The formation of the redistribution circuit structure 500 is described in detail herein. Referring to FIG. 2G, a dielectric layer 510 is formed over the active surfaces 210 of the dies 200 and the filler 400b. A material of the dielectric layer 510 may be identical to the material of the filler 400b or may be different from the material of the filler 400b. In other words, a material of the dielectric layer 510 is, for example, polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be easily patterned using a photolithography process. The dielectric layer 510 may be formed by suitable fabrication techniques such as spin-on coating, chemical vapor deposition (CVD), plasma-enhanced chemical vapor deposition (PECVD) or the like. In the case where the material of the dielectric layer 510 is identical to that of the filler 400b, although the filler 400b and the dielectric layer 510 are originated from the same material, due to the difference in manufacturing recipes, these two layers may be treated as two distinct layers. The dielectric layer 510 is patterned to expose connectors 206 of the dies 200 for the subsequent electrical connection processes. The patterning step includes performing a photolithography process or performing photolithography and etching processes.

Figure 2H:
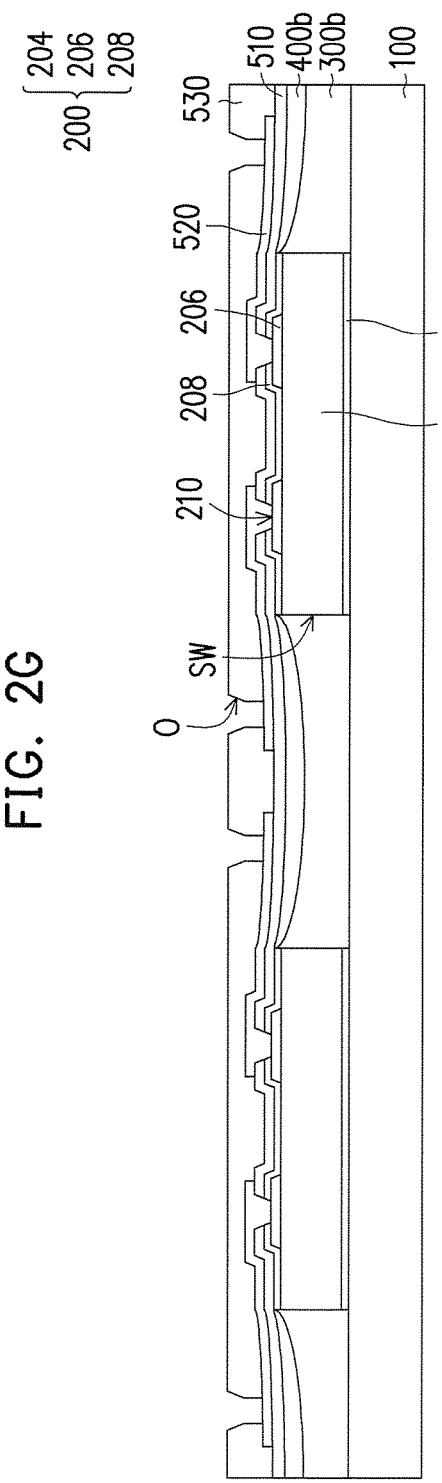

Referring to FIG. 2H, a patterned conductive layer 520 is subsequently formed over the dielectric layer 510. The patterned conductive layer 520 fills in the openings formed by the passivation layer 208 and the dielectric layer 510, so as to electrically connect with or directly in contact with the connectors 206 of the dies 200. In some embodiments, the patterned conductive layer 520 is made of conductive materials, such as copper, copper alloy, aluminum, aluminum alloy, or combinations thereof. The material of the patterned conductive layer 520 is not limited, as long as electrical connection between the connectors 206 of the dies 200 and other components is ensured. Similar to that of the dielectric layer 510, the patterned conductive layer 520 is also formed by performing a photolithography process or performing photolithography and etching processes.

As illustrated in FIG. 2G, since the recess 302 is filled by the filler 400b and the dielectric layer 510, the patterned conductive layer 520 is being disposed on a rather smooth surface. In other words, the filler 400b and the dielectric layer 510 contribute to the levelling of the sinkage of the recesses 302, thereby providing a smoother surface on which the patterned conductive layer 520 is subsequently formed. Therefore, the problem where the patterned conductive layer 520 is disconnected or bridged due to uneven surface derived from the recess 302 may be alleviated.

Referring to FIG. 2H, a dielectric layer 530 is formed over the patterned conductive layer 520. Similar to that of the dielectric layer 510, the dielectric layer 530 is also formed by performing a photolithography process or performing photolithography and etching processes. A material of the dielectric layer 530 may be the same or different from the material of the dielectric layer 510, including polyimide, PBO, BCB, a nitride such as silicon nitride, an oxide such as silicon oxide, PSG, BSG, BPSG, a combination thereof or the like. The dielectric layer 530 is also formed by suitable fabrication techniques such as spin-on coating, CVD, PECVD or the like. The dielectric layer 530 has a plurality of openings O exposing the patterned conductive layer 520.

Figures 2I, 2J:
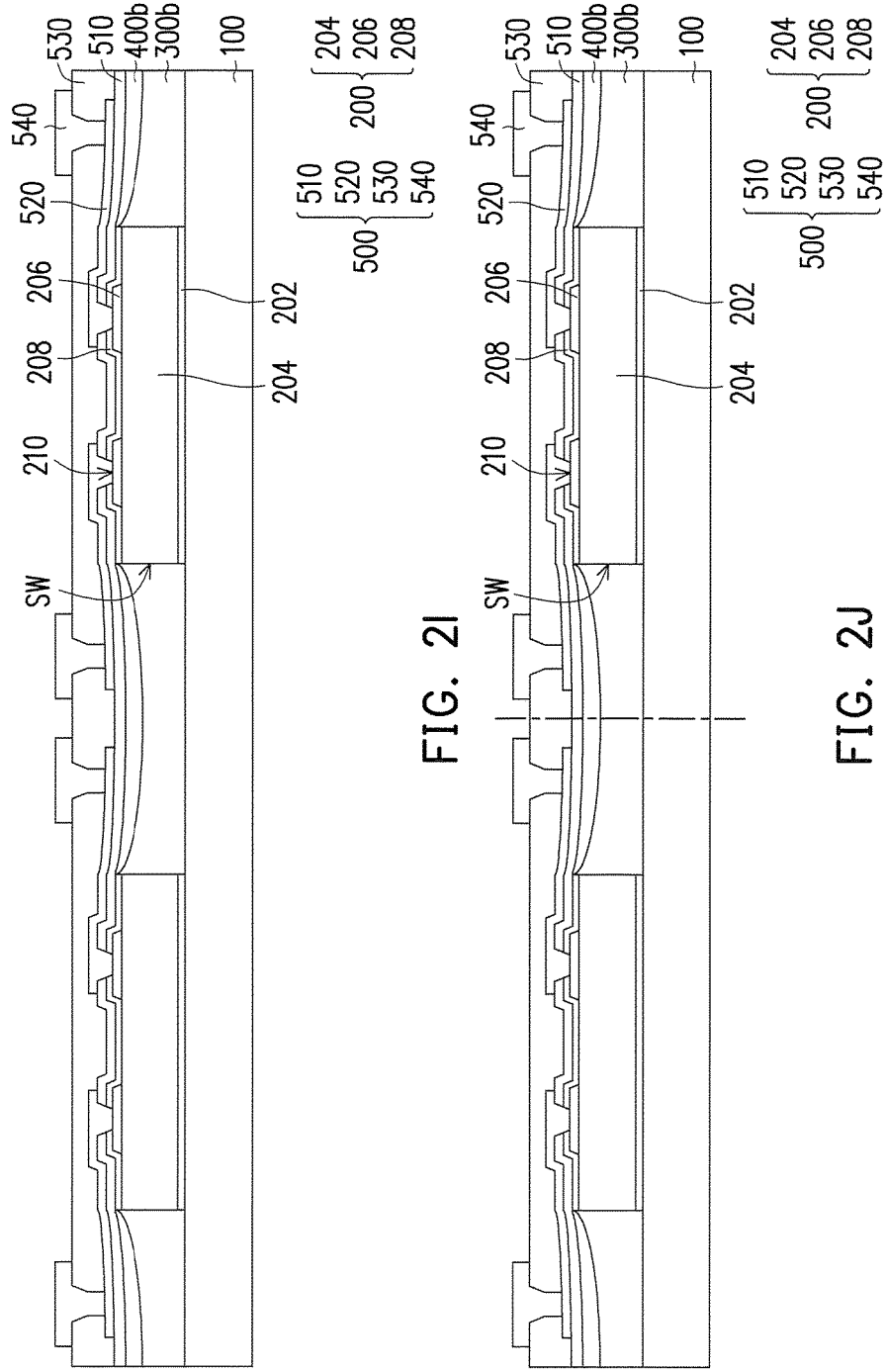

Referring to FIG. 2I, a plurality of conductive vias 540 are formed in the opening O. A material of the conductive vias 540 may be identical or different from the material of the patterned conductive layer 520. In other words, the conductive vias 540 are made of conductive materials, such as copper, copper alloy, aluminum, aluminum alloy, or combinations thereof. It is worth to note that the dielectric layer 510, the patterned conductive layer 520, the dielectric layer 530, and the conductive vias 540 constitute a redistribution circuit structure 500 which covers the active surfaces 210 of the dies 200 and the filler 400b.

Figure 2K:
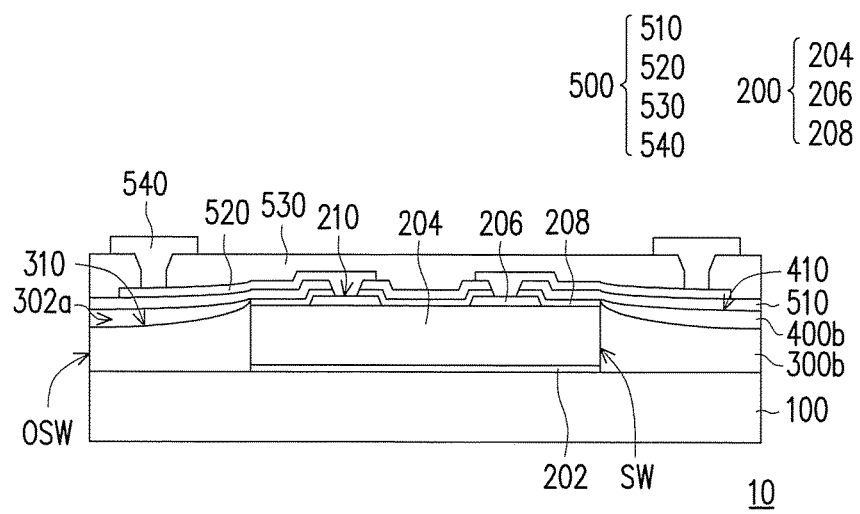

Referring to FIG. 1 and FIGS. 2J-2K, in Step S06, a dicing or singultion process is performed on the insulating encapsulation 300b to render a plurality of integrated fan-out packages 10. A cutting mechanism used for the singulation process typically involves dicing with a rotating blade or a laser beam. In other words, the dicing or singulation process is, for example, a laser cutting process or a mechanical cutting process.

Referring to FIG. 2K, an integrated fan-out package 10 includes a die 200, an insulating encapsulation 300b, a filler 400b, and a redistribution circuit structure 500. The die 200 includes a semiconductor chip 204, a plurality of connectors 206, and a passivation layer 208. A die attach film (DAF) 202 is formed between a bottom surface of the semiconductor chip 204 and a substrate 100 to enhance the adhesion between the die 200 and the substrate 100. However, it should be noted that the DAF 202 and the substrate 100 may be optional. In some alternative embodiments, a de-bonding process may be performed so the resulting integrated fan-out package 10 is separated from the substrate 100. The insulating encapsulation 300b encapsulates sidewalls SW of the die 200 and includes a recess 302a on a top surface 310 thereof. As illustrated in FIG. 2K, a depth of the recess 302a increases from sidewalls SW of the die 200 to outer sidewalls OSW of the insulating encapsulation 300b. In other words, the further away from the sidewalls SW of the die 200, the larger the depth of the recess 302a is. The filler 400b is located in the recess 302a and covers the top surface 310 of the insulating encapsulation 300b. The redistribution circuit structure 500 covers an active surface 210 of the die 200 and the filler 400b while being electrically connected to the connectors 206 of the die 200.

In some embodiments, the redistribution circuit structure 500 includes a dielectric layer 510 covering the active surface 210 of the dies 200 and the filler 400b, a patterned conductive layer 520 and a plurality of conductive vias 540 electrically connected to the die 200, and a dielectric layer 530 located between the patterned conductive layer 520 and the conductive vias 540. Since a sinkage of the top surface 410 of the filler 400b is less than a sinkage of the recess 302a, the subsequently formed patterned conductive layer 520 may be formed on a surface with a lesser sinkage. As such, break or bridge of the metallic lines in the redistribution circuit structure 500 may be eliminated, thereby improving the yield of the integrated fan-out packages.

Figure 2L:
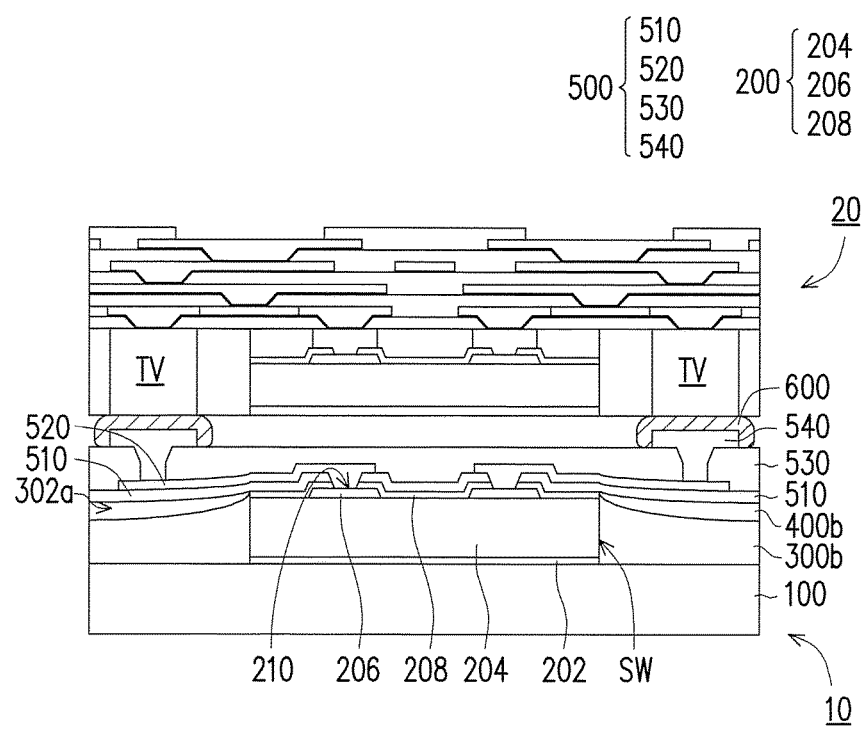
FIG. 2L is a schematic view illustrating an application of the integrated fan-out packages in FIG. 2K.

FIG. 2L is a schematic view illustrating an application of the integrated fan-out packages in FIG. 2K. The integrated fan-out package 10 may be stacked with other electronic device. For example, referring to FIG. 2L, another integrated fan-out package 20 is stacked on the integrated fan-out package 10, so as to form a package-on-package (PoP) device. Specifically, an electrical connection between the two packages is achieved by connecting through insulation vias TV of the integrated fan-out package 20 and the conductive vias 540 of the integrated fan-out package 10 using a solder paste 600 or the like. It should be noted that FIG. 2L merely serves as an exemplary illustration, and the disclosure is not limited thereto. In some alternative embodiments, the integrated fan-out package 10 may be stacked with other electronic devices such as a memory device, a ball grid array (BGA), or a wafer. Furthermore, the stacking may be performed preceding the dicing process. For example, the integrated fan-out package array may be stacked with a wafer, and the singulation process may be performed on the stacked fan-out package array and the wafer simultaneously.

Figure 5:
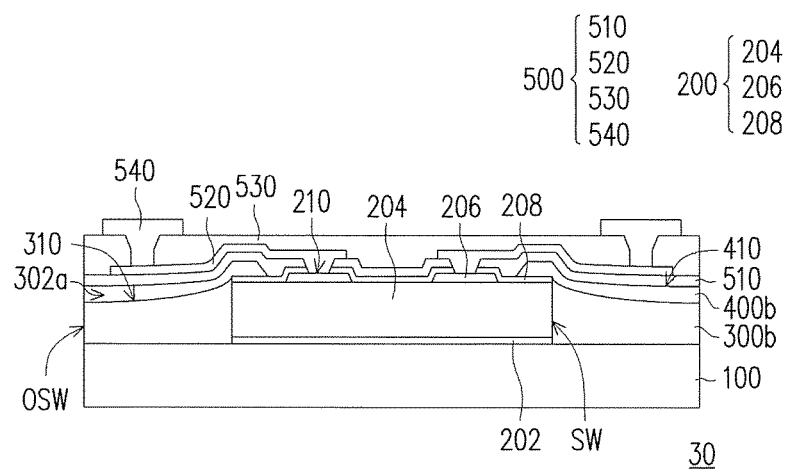
FIG. 5 is a cross-sectional view illustrating an integrated fan-out packages in accordance with some embodiments.

FIGS. 3A-3B are cross-sectional views illustrating intermediate steps for a manufacturing process of integrated fan-out packages in accordance with some embodiments. FIG. 5 is a cross-sectional view illustrating an integrated fan-out packages in accordance with some embodiments. In some embodiments, an alternative process of forming the filler 400b may also be utilized. That is, in some embodiments, the manufacturing processes of the integrated fan-out package 10 are similar to the processes presented in FIGS. 2A-2K except the processes of FIGS. 2E and 2F are replaced by the processes illustrated in FIGS. 3A-3B to form an integrated fan-out package 30 shown in FIG. 5. Referring to FIGS. 3A-3B, it should be noted that the processes herein are similar to that of FIGS. 2E-2F, and the difference lies in that in the processes of FIGS. 3A-3B, the opening OP of the mask M has a width W2 greater than the distance d between two adjacent dies 200. Specifically, a difference between the width W2 and the distance d is 2X, and X ranges from 10 μm to 200 μm. In other words, the exposure area of the photosensitive material 400a in FIG. 3A is larger than that of in FIG. 2E. As a result, the filler 400b not only forms within the recess 302, but also extends to cover a periphery regions P of the active surfaces 210, as illustrated in FIG. 3B.

Figure 6:
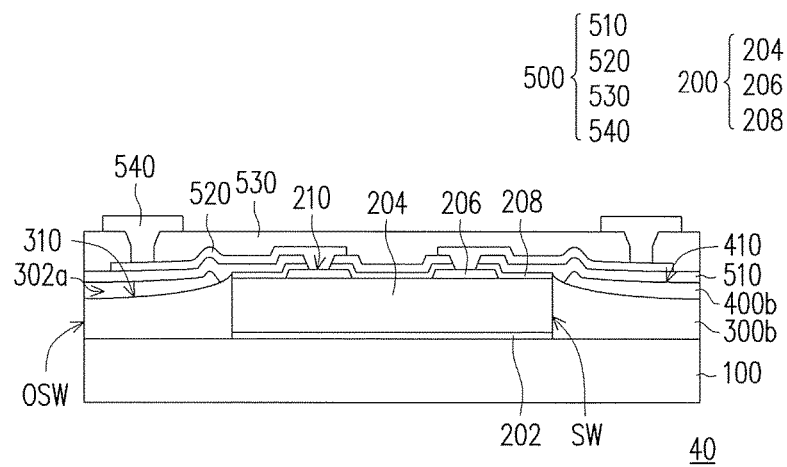
FIG. 6 is a cross-sectional view illustrating an integrated fan-out packages in accordance with some embodiments.

FIGS. 4A-4B are cross-sectional views illustrating intermediate steps for a manufacturing process of integrated fan-out packages in accordance with some embodiments. FIG. 6 is a cross-sectional view illustrating an integrated fan-out packages in accordance with some embodiments. In some embodiments, an alternative process of forming the filler 400b may also be utilized. That is, in some embodiments, the manufacturing processes of the integrated fan-out package 10 are similar to the processes presented in FIGS. 2A-2K except the processes of FIGS. 2E and 2F are replaced by the processes illustrated in FIGS. 4A-4B to form an integrated fan-out package 40 shown in FIG. 6. Referring to FIGS. 4A-4B, it should be noted that the processes herein are similar to that of FIGS. 2E-2F, and the difference lies in that in the processes of FIGS. 4A-4B, the opening OP of the mask M has a width W3 smaller than the distance d between two adjacent dies 200. Specifically, a difference between the width W3 and the distance d is 2X, and X ranges from 10 μm to 200 μm. In other words, the exposure area of the photosensitive material 400a in FIG. 4A is smaller than that of in FIG. 2E. As a result, the filler 400b exposes sidewalls SW of the dies 200, as illustrated in FIG. 4B. As mentioned above, when the encapsulation material layer 300a is slightly over-grinded, the highest level height of the top surface 310 of the recess 302 may be less than the height of the sidewalls SW of the dies 200. In this case, the insulating encapsulation 300b also exposes at least part of the sidewalls SW of the dies 200. That is, in some embodiments, portions of the sidewalls SW in the proximity of the active surface 210 are exposed by the insulating encapsulation 300b and the filler 400b.

In accordance with some embodiments of the present disclosure, an integrated fan-out package includes a die, an insulating encapsulation, a filler, and a redistribution circuit structure. The insulating encapsulation encapsulates sidewalls of the die and includes a recess on a top surface thereof. The filler covers the top surface of the insulating encapsulation while being at least partially filled in the recess. The redistribution circuit structure covers an active surface of the die and the filler. The redistribution circuit structure is electrically connected to the die and includes a dielectric layer covering the die and the filler.

In accordance with alternative embodiments of the present disclosure, an integrated fan-out package array includes a plurality of dies, an insulating encapsulation, a filler, and a redistribution circuit structure. The dies are arrange in an array over a substrate. The insulating encapsulation is over substrate and is located between the dies. The insulating encapsulation encapsulates sidewalls of the dies and includes at least one recess on a top surface thereof. The filler covers the top surface of the insulating encapsulation while being partially filled in the recess. The redistribution circuit structure covers active surfaces of the dies and the filler. The redistribution circuit structure is electrically connected to the dies and includes a dielectric layer covering the dies and the filler.

In accordance with yet alternative embodiments of the present disclosure, a method of manufacturing integrated fan-out packages includes at least the following steps. A plurality of dies are formed over a substrate. An encapsulation material layer is formed over the substrate, and the encapsulation material encapsulates the dies. Part of the encapsulation material layer is removed to expose active surfaces of the dies to form an insulating encapsulation. The insulating encapsulation is located between the dies. The insulating encapsulation encapsulates sidewalls of the dies and includes at least one recess on a top surface thereof. A filler is formed to cover the top surface of the insulating encapsulation while being at least partially in the recess. A redistribution circuit structure is formed to cover active surfaces of the dies and the filler. The redistribution circuit structure includes a dielectric layer covering the dies and the filler.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package, comprising:
a die;
an insulating encapsulation encapsulating at least part of sidewalls of the die, and exposing an entire active surface of the die, wherein the insulating encapsulation comprises a recess at a top surface thereof, and the recess is being at the same side as the active surface of the die;
a filler covering the top surface of the insulating encapsulation, and the filler being at least partially filled in the recess, wherein the filler exposes at least part of the recess and is spaced apart from the active surface of the die; and
a redistribution circuit structure covering the active surface of the die and the filler, the redistribution circuit structure being electrically connected to the die, wherein the redistribution circuit structure comprises a dielectric layer covering the die and the filler, and a material of the dielectric layer of the redistribution circuit structure is different from a material of the filler.

2. The integrated fan-out package according to claim 1, wherein portions of the sidewalls in the proximity of the active surface are exposed by the insulating encapsulation and the filler.

3. The integrated fan-out package according to claim 1, wherein a sinkage of a top surface of the filler is less than a sinkage of the recess.

4. The integrated fan-out package according to claim 1, wherein a maximum thickness of the filler is smaller than or equal to a maximum depth of the recess.

5. The integrated fan-out package according to claim 1, wherein a maximum thickness of the filler is greater than a maximum depth of the recess.

6. The integrated fan-out package according to claim 1, wherein a depth of the recess increases from sidewalls of the die to outer sidewalls of the insulating encapsulation.

7. The integrated fan-out package according to claim 1, where a material of the filler comprises a photosensitive material.

8. An integrated fan-out package array, comprising:
a plurality of dies arranged in an array over a substrate, wherein each die has a semiconductor chip and a plurality of connectors over a top surface of the semiconductor chip;
an insulating encapsulation over the substrate, the insulating encapsulation being between the dies and encapsulating sidewalls of the dies, wherein the insulating encapsulation comprises at least one recess on a top surface thereof, and a thickness of each semiconductor chip is greater than a minimum thickness of the insulating encapsulation;
a filler covering the top surface of the insulating encapsulation, and the filler being filled in the recess, wherein the filler contacts periphery regions of the active surfaces of the dies, the filler contacting the periphery regions of the active surfaces of the dies is spaced apart from the plurality of connectors of the dies, and the filler in the recess between the dies directly contacts the periphery regions of the dies; and
a redistribution circuit structure covering active surfaces of the dies and the filler, the redistribution circuit structure being electrically connected to the plurality of connectors of the dies, wherein the redistribution circuit structure comprises a dielectric layer covering the dies and the filler, the dielectric layer is directly in contact with an entire top surface of the filler located in the recess, and a material of the dielectric layer of the redistribution circuit structure is different from a material of the filler.

9. The integrated fan-out package array according to claim 8, wherein a sinkage of a top surface of the filler is less than a sinkage of the recess.

10. The integrated fan-out package array according to claim 8, wherein a maximum thickness of the filler is smaller than or equal to a maximum depth of the recess.

11. The integrated fan-out package array according to claim 8, wherein a maximum thickness of the filler is greater than a maximum depth of the recess.

12. The integrated fan-out package array according to claim 8, wherein a depth of the recess increases from sidewalls of the die to a center of the recess.

13. The integrated fan-out package array according to claim 8, wherein a material of the filler comprises a photosensitive material.

14. An integrated fan-out package array, comprising:
a plurality of dies arranged in an array over a substrate, wherein each die has a semiconductor chip;
an insulating encapsulation over the substrate, the insulating encapsulation being between the dies and encapsulating at least part of sidewalls of the dies, wherein the insulating encapsulation comprises at least one recess on a top surface thereof, the recess is being at the same side as active surfaces of the dies, and a thickness of each semiconductor chip is greater than a minimum thickness of the insulating encapsulation;
a filler covering the top surface of the insulating encapsulation, and the filler being at least partially filled in the recess, wherein the filler exposes at least part of the recess, and portions of the sidewalls in the proximity of the active surface are exposed by the insulating encapsulation and the filler; and
a redistribution circuit structure covering active surfaces of the dies and the filler, the redistribution circuit structure being electrically connected to the dies, wherein the redistribution circuit structure comprises a dielectric layer covering the dies and the filler, and a material of the dielectric layer of the redistribution circuit structure is different from a material of the filler.

15. The integrated fan-out package array according to claim 14, wherein a sinkage of a top surface of the filler is less than a sinkage of the recess.

16. The integrated fan-out package array according to claim 14, wherein a maximum thickness of the filler is smaller than or equal to a maximum depth of the recess.

17. The integrated fan-out package array according to claim 14, wherein a maximum thickness of the filler is greater than a maximum depth of the recess.

18. The integrated fan-out package array according to claim 14, wherein a depth of the recess increases from sidewalls of the die to a center of the recess.

19. The integrated fan-out package array according to claim 14, wherein a material of the filler comprises a photosensitive material.

20. The integrated fan-out package array according to claim 14, wherein the filler is spaced apart from the active surface of the die.

* * * * *